US011942949B2

(12) United States Patent
Wang

(10) Patent No.: US 11,942,949 B2
(45) Date of Patent: Mar. 26, 2024

(54) SIGNAL CORRECTION CIRCUIT AND SERVER

(71) Applicant: INSPUR SUZHOU INTELLIGENT TECHNOLOGY CO., LTD., Jiangsu (CN)

(72) Inventor: Xu Wang, Shandong (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/247,534

(22) PCT Filed: Sep. 29, 2021

(86) PCT No.: PCT/CN2021/121880
§ 371 (c)(1),
(2) Date: Mar. 31, 2023

(87) PCT Pub. No.: WO2022/127290
PCT Pub. Date: Jun. 23, 2022

(65) Prior Publication Data
US 2023/0378946 A1    Nov. 23, 2023

(30) Foreign Application Priority Data
Dec. 18, 2020   (CN) .......................... 202011507017.8

(51) Int. Cl.
*H03K 5/00* (2006.01)
*H03K 3/354* (2006.01)
*H03K 5/08* (2006.01)

(52) U.S. Cl.
CPC ............. *H03K 5/086* (2013.01); *H03K 3/354* (2013.01)

(58) Field of Classification Search
CPC ............................... H03K 5/086; H03K 3/354
(Continued)

(56) References Cited

U.S. PATENT DOCUMENTS 5,570,004 A * 10/1996 Shibata ..................... G05F 1/56
                                                                323/284
7,248,117 B1 * 7/2007 Li ........................... H03F 1/086
                                                                330/261
(Continued)

FOREIGN PATENT DOCUMENTS

CN      103095255 A     5/2013
CN      106160460 A     11/2016
(Continued)

OTHER PUBLICATIONS

International search report for PCT/CN2021/121880 dated Dec. 17, 2021.
(Continued)

*Primary Examiner* — Ryan Jager
(74) *Attorney, Agent, or Firm* — Dennemeyer & Associates LLC; Victoria Friedman

(57) ABSTRACT

A signal correction circuit and a server are provided. The circuit comprises: a first signal processing component receiving an input signal and positive power supply voltages and negative power supply voltages, generating a first control voltage, and outputting a first voltage, the first voltage being zero within a first time period; a second signal processing component generating a second control voltage according to the first control voltage, performing energy storage charging according to the second control voltage, controlling an energy storage charging voltage according to the second control voltage, and outputting a second voltage, and the second voltage being zero in the second time period; and an output component performing superposition processing on the first voltage and the second voltage to obtain an output signal.

20 Claims, 1 Drawing Sheet

(58) Field of Classification Search
USPC .......................................................... 327/73
See application file for complete search history.

(56) References Cited

U.S. PATENT DOCUMENTS

| | | | | |
|---|---|---|---|---|
| 7,853,235 | B2* | 12/2010 | Aparin ................... | H03F 1/301 |
| | | | | 455/295 |
| 8,866,541 | B2* | 10/2014 | Ali ......................... | G11C 27/02 |
| | | | | 327/551 |
| 10,026,734 | B2* | 7/2018 | Toner ................ | H01L 29/42376 |
| 10,181,821 | B2* | 1/2019 | Xu ...................... | H03F 3/45183 |
| 2007/0044024 | A1* | 2/2007 | Na ........................ | H03F 1/3252 |
| | | | | 715/764 |

FOREIGN PATENT DOCUMENTS

| CN | 109116266 A | 1/2019 |
|---|---|---|
| CN | 110264968 A | 9/2019 |
| CN | 111654267 A | 9/2020 |
| CN | 112713879 A | 4/2021 |

OTHER PUBLICATIONS

Search report for Chinese application No. 202011507017.8 filed on Dec. 18, 2020.

* cited by examiner

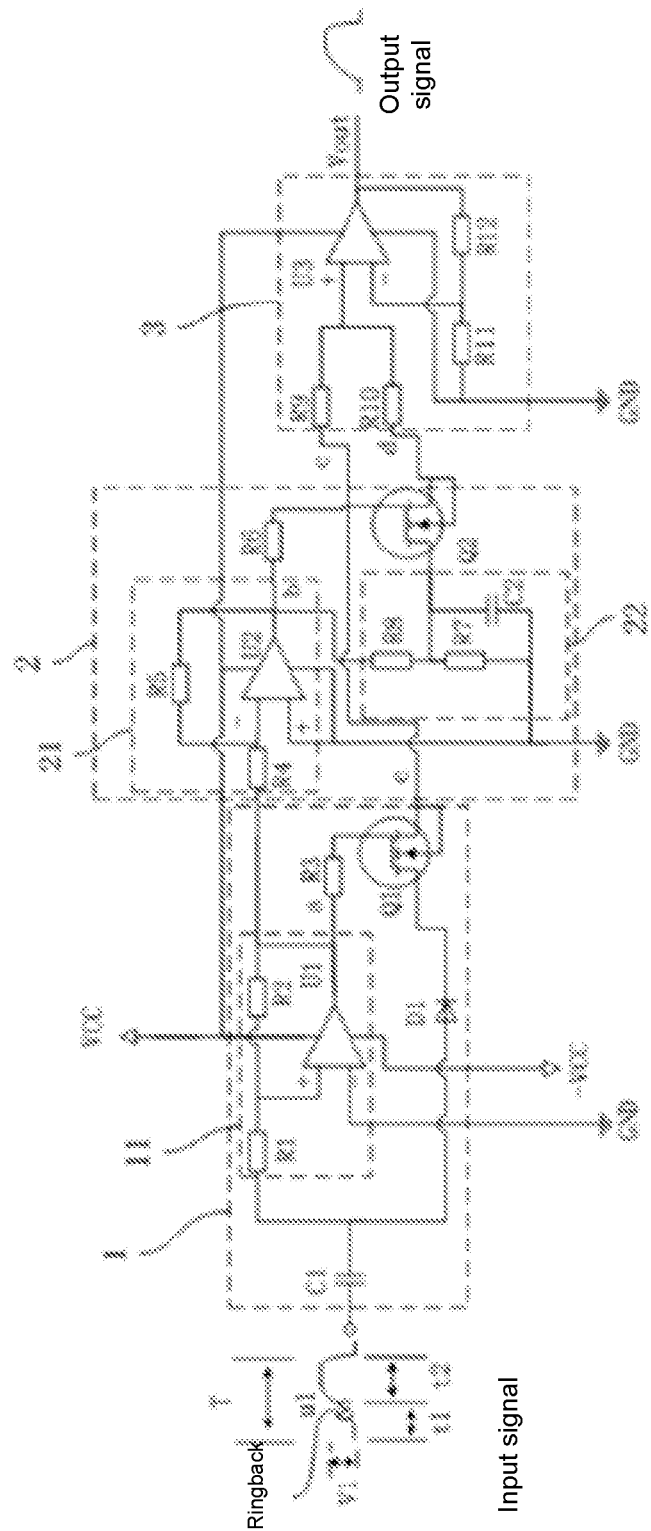

SIGNAL CORRECTION CIRCUIT AND SERVER

CROSS-REFERENCE TO RELATED APPLICATIONS

This is a 35 U.S.C. 371 National Stage Patent Application of International Application No. PCT/CN2021/121880, filed Sep. 29, 2021, which claims priority to Chinese application 202011507017.8, filed Dec. 18, 2020, each of which is hereby incorporated by reference in its entirety.

TECHNICAL FIELD

The disclosure relates to the technical field of electronics, and in particular, to a signal correction circuit and a server.

BACKGROUND

The ringback of a signal is a phenomenon which is difficult to solve in signal quality. The case of signal ringback is complex. The ringback at a rising edge usually occurs at the beginning of signal transmission. During the rising of a signal level, the signal level does not rises linearly, but the phenomena of wave rebounding will appear, and the wave rebounding part is the ringback of the signal. The ringback appearing at the rising edge is transmitted to a signal receiving end, which is likely to cause misjudgment, thus causing serious signal quality accidents.

The reasons for the ringback are also complex, most of the ringback are due to that the topology of a link is complex and the signal is reflected because of signal impedance mismatch, some phenomenons of the ringback are caused by serious crosstalk in the link, and some phenomenons of the ringback are caused by the sudden change of the load. Therefore, the reasons for the ringback are complex and difficult to find. In related arts, the method for eliminating the ringback is to change the topology of the link. Debugging is performed at a signal source end or a signal terminal, and the matching of impedance is performed, or a link system is revised, so as to increase the spacing, and reduce the crosstalk. However, the debugging time and cost are greatly increased by the above methods, which results in that products cannot be produced on time.

SUMMARY

The embodiments of the disclosure provide a signal correction circuit, which includes a first signal processing component, a second signal processing component, and an output component.

The first signal processing component is configured to receive an input signal and positive power supply voltages and negative power supply voltages, generate a first control voltage according to the input signal and the positive power supply voltages and negative power supply voltages, control the input signal according to the first control voltage, and output a first voltage. The first voltage is zero within a first time period, and the waveform of the first voltage in a second time period is the same as the waveform of the input signal in the second time period.

The second signal processing component is electrically connected to the first signal processing component, and is configured to generate a second control voltage according to the first control voltage, perform energy storage charging according to the second control voltage, control an energy storage charging voltage according to the second control voltage, and output a second voltage. The corresponding waveform of the second voltage in the first time period includes a smooth monotonic rising curve and a straight line connected to the smooth monotonic rising curve, and the second voltage is zero in the second time period.

The output component is electrically connected to each of the first signal processing component and the second signal processing component, and is configured to perform superposition processing on the first voltage and the second voltage to obtain an output signal. The waveform of the output signal in the first time period is the same as the waveform of the second voltage in the first time period, and the waveform of the output signal in the second time period is the same as the waveform of the first voltage in the second time period.

In some embodiments, the first signal processing component includes a first feedback amplification unit, and a first N-type Metal-Oxide-Semiconductor (NMOS) tube.

The first feedback amplification unit is configured to receive the input signal and the positive power supply voltages and negative power supply voltages, and generate the first control voltage according to the input signal and the positive power supply voltages and negative power supply voltages.

A grid of the first NMOS tube is electrically connected to an output end of the first feedback amplification unit, a drain of the first NMOS tube receives the input signal, and a source of the first NMOS tube is electrically connected to an input end of the output component.

In some embodiments, the first feedback amplification unit includes a first amplifier, a first resistor, and a second resistor.

A negative-phase input end of the first amplifier is connected to the ground, and two power supply ends of the first amplifier are respectively connected to a positive supply voltage and a negative positive supply voltage.

A first end of the first resistor receives the input signal, and a second end of the first resistor is connected to a positive-phase input end of the first amplifier.

A first end of the second resistor is connected to the positive-phase input end of the first amplifier, and a second end of the second resistor is connected to an output end of the first amplifier.

In some embodiments, the first signal processing component further includes a first capacitor, a diode, and a third resistor.

A first end of the diode receives the input signal through the first capacitor, and a second end of the diode is connected to a drain of the first NMOS tube.

A first end of the third resistor is connected to the output end of the first amplifier, and a second end of the third resistor is connected to a source of the first NMOS tube.

In some embodiments, the second signal processing component includes a second feedback amplification unit, and an energy storage unit, and a second NMOS tube.

The second feedback amplification unit is configured to receive the first control voltage, and generate the second control voltage according to the first control voltage.

The energy storage unit is electrically connected to an output end of the second feedback amplification unit, and is configured to perform energy storage charging in the first time period.

A drain of the second NMOS tube is connected to the ground through the energy storage unit, a grid of the second NMOS tube is connected to an output end of the second feedback amplification unit, and a source of the second NMOS tube is electrically connected to an input end of the output component.

In some embodiments, the second feedback amplification unit includes a fourth resistor, a fifth resistor, and a second amplifier.

A negative-phase input end of the second amplifier is connected to an output end of the first signal processing component through the fourth resistor, a negative-phase input end and an output end of the second amplifier are connected in parallel with the fifth resistor, and two power supply ends of the second amplifier are respectively connected to a positive supply voltage and connected to the ground.

In some embodiments, the signal correction circuit further includes a sixth resistor.

A first end of the sixth resistor is connected to an output end of the second feedback amplification unit, and a second end of the sixth resistor is connected to a grid of the second NMOS tube.

The energy storage unit includes a second capacitor, a seventh resistor, and an eighth resistor.

A first end of the second capacitor is connected to a drain of the second NMOS tube, and a second end of the second capacitor is connected to the ground.

The seventh resistor is connected in parallel with the second capacitor.

A first end of the eighth resistor is connected to an output end of the second feedback amplification unit, and a second end of the eighth resistor is connected to the ground through the seventh resistor.

In some embodiments, the output component includes a ninth resistor, a tenth resistor, an eleventh resistor, a twelfth resistor, and a third resistor.

A first end of the twelfth resistor is connected to the ground through the eleventh resistor.

A positive-phase input end of the third amplifier is connected to each of the output ends of the first signal processing component and the second signal processing component through the ninth resistor and the tenth resistor respectively, a negative-phase input end of the third amplifier is connected to the ground through the eleventh resistor, an output end of the third amplifier is connected to a second end of the twelfth resistor, and two power supply ends of the third amplifier are respectively connected to a positive supply voltage and connected to the ground.

In some embodiments, the resistance of the eleventh resistor is the same as that of the twelfth resistor.

The embodiments of the disclosure provide a server, which includes the abovementioned signal correction circuit.

BRIEF DESCRIPTION OF THE DRAWINGS

In order to describe the technical solutions in the embodiments of the disclosure more clearly, the drawings required to be used in descriptions about the embodiments will be simply introduced below. Apparently, the drawings in the following descriptions are some embodiments of the disclosure. Those of ordinary skill in the art may further obtain other drawings according to these drawings without creative work.

FIG. 1 is a schematic diagram of a signal correction circuit provided by the embodiments of the disclosure.

DETAILED DESCRIPTION OF THE EMBODIMENTS

To make those skilled in the art in the technical field to which the disclosure belongs understand the disclosure more clearly, technical solutions of the disclosure are described in detail below through specific embodiments in combination with accompanying drawings.

The embodiments of the disclosure provide a signal correction circuit. As shown in FIG. 1, the circuit includes a first signal processing component 1, a second signal processing component 2, and an output component 3.

The first signal processing component 1 is configured to receive an input signal and positive power supply voltages and negative power supply voltages, generate a first control voltage according to the input signal and the positive power supply voltages and negative power supply voltages, control the input signal according to the first control voltage, and output a first voltage. The first voltage is zero within a first time period, and the waveform of the first voltage in a second time period is the same as the waveform of the input signal in the second time period.

The input signal is a signal to be corrected. The input signal may be a pulse signal. A rising edge of the pulse signal has a ringback, that is, a non-monotonic condition occurs during the rise of a signal level. The period of the pulse signal is T. The time t1 of a non-monotonic part is the first time period, and the time t2 of a normal part is the second time period. The highest threshold voltage of the ringback part is V1, that is, the waveform of the pulse signal is normal after V1.

The first signal processing component 1 includes a first feedback amplification unit 11, and a first NMOS tube Q1. The NMOS tube is a N-type Metal-Oxide-Semiconductor Field-Effect Transistor, that is, a MOSFET tube.

The first feedback amplification unit 11 is configured to receive the input signal and the positive power supply voltages and negative power supply voltages, and generate the first control voltage according to the input signal and the positive power supply voltages and negative power supply voltages.

A grid of the first NMOS tube Q1 is electrically connected to an output end of the first feedback amplification unit 11, a drain of the first NMOS Q1 tube receives the input signal, and a source of the first NMOS tube Q1 is electrically connected to an input end of the output component 3.

The first feedback amplification unit 11 includes a first amplifier U1, a first resistor R1, and a second resistor R2.

A negative-phase input end of the first amplifier U1 is connected to the ground GND, and two power supply ends of the first amplifier U1 are respectively connected to a positive supply voltage VCC and a negative positive supply voltage −VCC.

A first end of a first resistor R1 receives the input signal, and a second end of the first resistor R1 is connected to a positive-phase input end of the first amplifier U1.

A first end of a second resistor R2 is connected to a positive-phase input end of the first amplifier U1, and a second end of the second resistor R2 is connected to an output end of the first amplifier U1.

The first amplifier U1 is in a positive and negative feedback amplification state. It can be known from a voltage superposition principle that the positive-phase input end voltage of the first amplifier U1 is that $U1+=R2*u1/(R1+R2)+R1*Ua/(R1+R2)$, u1 is the input signal, Ua is the voltage at node a, and U1− is the negative-phase input end of the first amplifier U1. When $U1+=U1-=0$, the first amplifier U1 outputs an overturned critical voltage. It can be obtained from the above equation that, when the input signal is that $u1=-R1*a/R2$, that is, an overturned threshold voltage is output, the threshold voltage is recorded as V1. Since the first amplifier U1 is in an amplified state, when the output is positive, an output signal is VCC; and when the output is negative, an output signal is −VCC. Since the voltage of the node a before hopping is −VCC, it can be obtained that the threshold voltage is that V1=R1*VCC/R2. If R1=0.5*R2, that is, when u1 is greater than 0.5*VCC, Ua is VCC, and on the contrary, Ua is −VCC.

For the first NMOS tube Q1, when u1 is less than V1, the first NMOS tube Q1 is turned off. When u1 is greater than V1, the first NMOS tube Q1 is turned on, during t1, the voltage Uc at the node c is 0. During t2, the voltage Uc at the node c is u1. At this moment, the voltage at the node c is equivalent to a waveform in which all ringback part of u1 is changed into 0 and the rest of the time is equal to u1.

The first signal processing component 1 further includes a first capacitor C1, a second diode D1, and a third resistor R3.

A first end of the diode D1 receives the input signal through the first capacitor C1, and a second end of the diode D1 is connected to a drain of the first NMOS tube Q1. A Direct Current (DC) offset voltage in the input signal may be filtered away through the first capacitor C1. The input signal is divided into two paths after passing through the first capacitor C1. The first path is input into the positive-phase input end of the first amplifier U1, and the second path is input into a positive electrode of the diode D1.

A first end of the third resistor R3 is connected to the output end of the first amplifier U1, and a second end of the third resistor R3 is connected to the source of the first NMOS tube Q1.

The second signal processing component 2 is electrically connected to the first signal processing component 1, and is configured to generate a second control voltage according to the first control voltage, perform energy storage charging according to the second control voltage, control an energy storage charging voltage according to the second control voltage, and output a second voltage. The corresponding waveform of the second voltage in the first time period includes a smooth monotonic rising curve and a straight line connected to the smooth monotonic rising curve, and the second voltage is zero in the second time period.

The second signal processing component 2 includes a second feedback amplification unit 21, an energy storage unit 22, and a second NMOS tube Q2.

The second feedback amplification unit 21 is configured to receive the first control voltage, and generate the second control voltage according to the first control voltage.

The energy storage unit 22 is electrically connected to an output end of the second feedback amplification unit 21, and is configured to perform energy storage charging in the first time period.

A drain of the second NMOS tube Q2 is connected to the ground GND through the energy storage unit 22, a grid of the second NMOS tube Q2 is connected to an output end of the second feedback amplification unit 21, and a source of the second NMOS tube Q2 is electrically connected to an input end of the output component 3.

The second feedback amplification unit 21 includes a fourth resistor R4, a fifth resistor R5, and a second amplifier U2.

A negative-phase input end of the second amplifier U2 is connected to an output end of the first signal processing component 1 through the fourth resistor R4, a negative-phase input end and an output end of the second amplifier U2 are connected in parallel with the fifth resistor R5, and two power supply ends of the second amplifier U2 are respectively connected to a positive supply voltage VCC and connected to the ground GND.

The second amplifier U2 is in a negative feedback state, and meets the characteristics of a virtual short circuit and a virtual open circuit of an operational amplifier. It can be obtained that the voltage of the second amplifier U2 at output node b is that Ub=−R5*a/R4. If R5=R4, it can be obtained that Ub=−Ua. That is, during a period t1, Ub=VCC. During time t2, Ub=−VCC. For the second NMOS tube Q2, during time t1, the second NMOS tube Q2 is turned on, and during time t2, the second NMOS tube Q2 is turned off. During t1, b performs energy storage charging on C2 through R8. This circuit needs to take R1/R2=R8/R7, so that the corresponding voltage value is equal to a threshold voltage V1 when the capacitor C2 reaches a stable state. At the beginning of t1, the voltage waveform at C2 is a linear growth smooth curve, and because the second NMOS tube Q2 is turned on in this time period, the voltage waveform at node d is a smooth monotonic rising curve in a time period t1 and remains stable until it reaches the threshold voltage V1. The effect of correcting the waveform can be achieved by adjusting parameters. Similarly, in a time period t2, the second NMOS tube Q2 is turned off, and the voltage Ud at node d is 0.

The signal correction circuit further includes a sixth resistor R6.

A first end of the sixth resistor R6 is connected to an output end of the second feedback amplification unit 21, and a second end of the sixth resistor R6 is connected to a grid of the second NMOS tube Q2. The sixth resistor R6 is configured to limit the current of the output end of the second amplifier U2.

The energy storage unit 22 includes a second capacitor C2, a seventh resistor R7, and an eighth resistor R8.

A first end of the second capacitor C2 is connected to a drain of the second NMOS tube Q2, and a second end of the second capacitor C2 is connected to the ground. The seventh resistor R7 is connected in parallel with the second capacitor C2. A first end of the eighth resistor R8 is connected to an output end of the second feedback amplification unit 21, and a second end of the eighth resistor R8 is connected to the ground through the seventh resistor R7.

The output component 3 is electrically connected to each of the first signal processing component 1 and a second signal processing component 2, and is configured to perform superposition processing on the first voltage and the second voltage to obtain an output signal. The output signal is a corrected voltage signal. The waveform of the output signal in the first time period is the same as the waveform of the second voltage in the first time period, and the waveform of the output signal in the second time period is the same as the waveform of the first voltage in the second time period.

The output component 3 includes a ninth resistor R9, a tenth resistor R10, an eleventh resistor R11, a twelfth resistor R12, and a third amplifier U3. The ninth resistor R9 is equal to the tenth resistor R10.

A first end of the twelfth resistor R12 is connected to the ground GND through the eleventh resistor R11. A positive-phase input end of the third amplifier U3 is connected to each of the output ends of the first signal processing component 1 and the second signal processing component 2 through the ninth resistor R9 and the tenth resistor R10 respectively. A negative-phase input end of the third amplifier U3 is connected to the ground GND through the eleventh resistor R11, an output end of the third amplifier U3 is connected to a second end of the twelfth resistor R12, and two power supply ends of the third amplifier U3 are respectively connected to a positive supply voltage VCC and connected to the ground GND. The resistance of the eleventh resistor R 11 is the same as that of the twelfth resistor R12.

The third amplifier U3 is in a negative feedback state, and has the characteristics of a virtual short circuit and a virtual open circuit. On the basis that the current at node c is equal to the current at node d, $(U3+-Uc)/R9=(Ud-U3+)/R10$, $R9=R10$, $U3+$ is a positive-phase input end voltage of the third NMOS tube Q3, and $U3-$ is a negative-phase input end voltage of the third NMOS tube Q3, it can be obtained that $U3+=0.5*(Uc+Ud)$. According to a voltage division principle, it is obtained that $U3-=Vout*R11/(R11+R12)$. According to the virtual short circuit, it is obtained that $U3+=U3-$, and an output signal $Vout=0.5*(Uc+Ud)*(R11+R12)/R11=0.5*(1+R12/R11)*(Uc+Ud)$ is obtained. At this moment, if $R11=R12$, the output signal is $Vout=Uc+Ud$. Therefore, the output signal Vout is a smooth rising curve during t1. The waveform during t2 is consistent with the waveform of the input signal u1. Therefore, an input rising edge ringback part is replaced with a smooth curve, and a ringback is corrected and eliminated.

In another embodiment provided by the present disclosure, VCC is 5V, C1 is 0.01 uF, C2 is 4.7 Uf, R1 is 5K, R2, R4, R5, R8, R9, R10, R7, R11, and R12 are all 10 K, R3 and R6 are 100K, U1 and U2 are high slew rate optional amplifiers 351, U3 is an ordinary LM307 operational amplifier, D1 is a 1N4007 switching diode, and Q1 and Q2 are AO3402N type MOS tubes.

Detailed description is made as follows.
1) When there is an input signal u1 input into the circuit, according to the previous equivalent analysis, since $R1=0.5*R2$, the output a of the U1 is $-5V$ in an interval t1 and the output is 5V in an interval t2. A threshold voltage $V1=2.5$ V, that is, the ringback in the circuit is located in an interval where the voltage value is less than 2.5 V. According to the actual position of the ringback, the resistance of R1 and R2 are adjusted appropriately to eliminate the ringback.
2) At this moment, Q1 is turned off in the interval t1; and when Uc=0, Q2 is turned on, and U2 starts to charge C2 through R8. The voltage Ud at d is equal to the energy storage voltage on the capacitor C2. Since $R1/R2=R8/R7=1$, the voltage of the capacitor C2 is equal to V1 when it is stable. The corresponding waveform is a monotonically rising smooth curve, so that the output waveforms can be connected at V1. The shape of the curve can be adjusted by adjusting the values of R8 and C2 can be adjusted according to actual needs. Since $R11=R12=10k$, according to above analysis, it can be obtained that the output is the superposition of Uc and Ud in the interval t1. Therefore, the output is a smooth monotonic rising curve.
3) Similarly, in the interval t2, D1 is turned on in one way, which prevents the circuit from backflow to damage a signal source end. The output of U1 is 5V, and Q1 is turned on; the output of U2 is $-5V$, and Q2 is turned off. At this moment, the output signal Vout is equal to an input signal u1, starts to change from V1, and is equal to u1. In conclusion, the output signal Vout eliminates the ringback in the input signal u1, and the ringback at the rising edge is corrected and eliminated by the circuit.

The embodiments of the disclosure further provide a server, which includes the abovementioned signal correction circuit.

In conclusion, according to the signal correction circuit and the server provided by the disclosure, a circuit structure is reset to divide the input signal into two paths, which are respectively output into the first signal processing component 1 and the second signal processing component 2. The first signal processing component 1 eliminates a ringback-containing part in the waveform of the input signal. The second signal processing component 2 adjusts the ringback-containing part in the waveform of the input signal, and the waveform of an output signal is a smooth monotonic rising curve. Superposition processing is performed on the first voltage output by the first signal processing component 1 and the second voltage output by the second signal processing component 2, and the ringback part in the obtained output signal is completely eliminated. The circuit is redesigned, and various components in the circuit do not need to be debugged and revised for the input signal, so that the cost of debugging, revision, and the like can be reduced, and the input signal is corrected conveniently, stably, and reliably.

While preferred embodiments of the disclosure have been described, those skilled in the art can make additional changes and modifications to the embodiments once knowing a basic creativity concept. Therefore, the appended claims are intended to be interpreted as including the preferred embodiments and all the changes and modifications falling within the scope of the disclosure.

It is apparent that those skilled in the art can make various modifications and variations to the disclosure without departing from the spirit and scope of the disclosure. Thus, if such modifications and variations of the disclosure fall within the scope of the appended claims and their equivalents of the disclosure, the disclosure is also intended to cover the modifications and variations.

What is claimed is:

1. A signal correction circuit, comprising:
   a first signal processing component, configured to receive an input signal, positive power supply voltages and negative power supply voltages, generate a first control voltage according to the input signal, the positive power supply voltages and negative power supply voltages, control the input signal according to the first control voltage, and output a first voltage, the first voltage is zero within a first time period, and the waveform of the first voltage in a second time period is the same as the waveform of the input signal;
   a second signal processing component, electrically connected to the first signal processing component, and configured to generate a second control voltage according to the first control voltage, perform energy storage charging according to the second control voltage, control an energy storage charging voltage according to the second control voltage, and output a second voltage, the corresponding waveform of the second voltage in the first time period comprises a smooth monotonic rising curve and a straight line connected to the smooth monotonic rising curve, and the second voltage is zero in the second time period; and
   an output component, electrically connected to each of the first signal processing component and the second signal processing component respectively, and configured to perform superposition processing on the first voltage and the second voltage to obtain an output signal, the waveform of the output signal in the first time period is the same as the waveform of the second voltage in the first time period, and the waveform of the output signal in the second time period is the same as the waveform of the first voltage in the second time period.

2. The signal correction circuit as claimed in claim 1, wherein the first signal processing component comprises:

a first feedback amplification unit, configured to receive the input signal and the positive power supply voltages and negative power supply voltages, and generate the first control voltage according to the input signal, the positive power supply voltages and negative power supply voltages; and a first N-type Metal-Oxide-Semiconductor (NMOS) tube, a grid of the first NMOS tube being electrically connected to an output end of the first feedback amplification unit, a drain of the first NMOS tube receiving the input signal, and a source of the first NMOS tube being electrically connected to an input end of the output component.

3. The signal correction circuit as claimed in claim 2, wherein the first feedback amplification unit comprises:

a first amplifier, a negative-phase input end of the first amplifier being connected to the ground, and two power supply ends of the first amplifier being respectively connected to a positive supply voltage and a negative positive supply voltage;

a first resistor, a first end of the first resistor receiving the input signal, and a second end of the first resistor being connected to a positive-phase input end of the first amplifier; and a second resistor, a first end of the second resistor being connected to the positive-phase input end of the first amplifier, and a second end of the second resistor being connected to an output end of the first amplifier.

4. The signal correction circuit as claimed in claim 3, wherein the first signal processing component further comprises:

a first capacitor;

a diode, a first end of the diode receiving the input signal through the first capacitor, and a second end of the diode being connected to a drain of the first NMOS tube; and a third resistor, a first end of the third resistor being connected to the output end of the first amplifier, and a second end of the third resistor being connected to the source of the first NMOS tube.

5. The signal correction circuit as claimed in claim 3, wherein the first amplifier is in a positive and negative feedback state.

6. The signal correction circuit as claimed in claim 3, wherein the third amplifier is in a negative feedback state and meets characteristics of a virtual short circuit and a virtual open circuit.

7. The signal correction circuit as claimed in claim 1, wherein the second signal processing component comprises:

a second feedback amplification unit, configured to receive the first control voltage, and generate the second control voltage according to the first control voltage;

an energy storage unit, electrically connected to an output end of the second feedback amplification unit, and configured to perform energy storage charging in the first time period; and a second NMOS tube, a drain of the second NMOS tube being connected to the ground through the energy storage unit, a grid of the second NMOS tube being connected to an output end of the second feedback amplification unit, and a source of the second NMOS tube being electrically connected to an input end of the output component.

8. The signal correction circuit as claimed in claim 7, wherein the second feedback amplification unit comprises:

a fourth resistor;

a fifth resistor; and a second amplifier, a negative-phase input end of the second amplifier being connected to an output end of the first signal processing component through the fourth resistor, a negative-phase input end and an output end of the second amplifier being connected in parallel with the fifth resistor, and two power supply ends of the second amplifier being respectively connected to a positive supply voltage and connected to the ground.

9. The signal correction circuit as claimed in claim 8, wherein the second amplifier is in a negative feedback state, and meets characteristics of a virtual short circuit and a virtual open circuit of an operational amplifier.

10. The signal correction circuit as claimed in claim 7, wherein the signal correction circuit further comprises:

a sixth resistor, a first end of the sixth resistor being connected to an output end of the second feedback amplification unit, and a second end of the sixth resistor being connected to a grid of the second NMOS tube;

the energy storage unit comprises:

a second capacitor, a first end of the second capacitor being connected to a drain of the second NMOS tube, and a second end of the second capacitor being connected to the ground;

a seventh resistor, the seventh resistor being connected in parallel with the second capacitor; and an eighth resistor, a first end of the eighth resistor being connected to an output end of the second feedback amplification unit, and a second end of the eighth resistor being connected to the ground through the seventh resistor.

11. The signal correction circuit as claimed in claim 1, wherein the output component comprises:

a ninth resistor;

a tenth resistor;

an eleventh resistor;

a twelfth resistor, a first end of the twelfth resistor being connected to the ground through the eleventh resistor; and a third amplifier, a positive-phase input end of the third amplifier being connected to each of the output ends of the first signal processing component and the second signal processing component through the ninth resistor and the tenth resistor respectively, a negative-phase input end of the third amplifier being connected to the ground through the eleventh resistor, an output end of the third amplifier being connected to a second end of the twelfth resistor, and two power supply ends of the third amplifier being respectively connected to a positive supply voltage and connected to the ground.

12. The signal correction circuit as claimed in claim 11, wherein the resistance of the eleventh resistor is the same as that of the twelfth resistor.

13. The signal correction circuit as claimed in claim 1, wherein the input signal is a pulse signal to be corrected, and a rising edge of the pulse signal has a ringback.

14. The signal correction circuit as claimed in claim 1, wherein the first time period is a non-monotonic part and the second time period time is a normal part.

15. A server, comprising a signal correction circuit, the signal correction circuit comprises:

a first signal processing component, configured to receive an input signal, positive power supply voltages and negative power supply voltages, generate a first control voltage according to the input signal, the positive power supply voltages and negative power supply voltages, control the input signal according to the first control voltage, and output a first voltage, the first voltage is zero within a first time period, and the waveform of the first voltage in a second time period is the same as the waveform of the input signal;

a second signal processing component, electrically connected to the first signal processing component, and configured to generate a second control voltage according to the first control voltage, perform energy storage charging according to the second control voltage, control an energy storage charging voltage according to the second control voltage, and output a second voltage, the corresponding waveform of the second voltage in the first time period comprises a smooth monotonic rising curve and a straight line connected to the smooth monotonic rising curve, and the second voltage is zero in the second time period; and an output component, electrically connected to each of the first signal processing component and the second signal processing component respectively, and configured to perform superposition processing on the first voltage and the second voltage to obtain an output signal, the waveform of the output signal in the first time period is the same as the waveform of the second voltage in the first time period, and the waveform of the output signal in the second time period is the same as the waveform of the first voltage in the second time period.

16. The server as claimed in claim 15, wherein the first signal processing component comprises:

a first feedback amplification unit, configured to receive the input signal and the positive power supply voltages and negative power supply voltages, and generate the first control voltage according to the input signal, the positive power supply voltages and negative power supply voltages; and a first N-type Metal-Oxide-Semiconductor (NMOS) tube, a grid of the first NMOS tube being electrically connected to an output end of the first feedback amplification unit, a drain of the first NMOS tube receiving the input signal, and a source of the first NMOS tube being electrically connected to an input end of the output component.

17. The server as claimed in claim 16, wherein the first feedback amplification unit comprises:

a first amplifier, a negative-phase input end of the first amplifier being connected to the ground, and two power supply ends of the first amplifier being respectively connected to a positive supply voltage and a negative positive supply voltage;

a first resistor, a first end of the first resistor receiving the input signal, and a second end of the first resistor being connected to a positive-phase input end of the first amplifier; and a second resistor, a first end of the second resistor being connected to the positive-phase input end of the first amplifier, and a second end of the second resistor being connected to an output end of the first amplifier.

18. The server as claimed in claim 17, wherein the first signal processing component further comprises:

a first capacitor;

a diode, a first end of the diode receiving the input signal through the first capacitor, and a second end of the diode being connected to a drain of the first NMOS tube; and a third resistor, a first end of the third resistor being connected to the output end of the first amplifier, and a second end of the third resistor being connected to the source of the first NMOS tube.

19. The server as claimed in claim 15, wherein the second signal processing component comprises:

a second feedback amplification unit, configured to receive the first control voltage, and generate the second control voltage according to the first control voltage;

an energy storage unit, electrically connected to an output end of the second feedback amplification unit, and configured to perform energy storage charging in the first time period; and a second NMOS tube, a drain of the second NMOS tube being connected to the ground through the energy storage unit, a grid of the second NMOS tube being connected to an output end of the second feedback amplification unit, and a source of the second NMOS tube being electrically connected to an input end of the output component.

20. The server as claimed in claim 19, wherein the second feedback amplification unit comprises:

a fourth resistor;

a fifth resistor; and a second amplifier, a negative-phase input end of the second amplifier being connected to an output end of the first signal processing component through the fourth resistor, a negative-phase input end and an output end of the second amplifier being connected in parallel with the fifth resistor, and two power supply ends of the second amplifier being respectively connected to a positive supply voltage and connected to the ground.

* * * * *